(12) United States Patent
Haze et al.

(10) Patent No.: US 6,333,634 B1
(45) Date of Patent: Dec. 25, 2001

(54) METHOD FOR MEASURING RADIO-FREQUENCY CURRENT

(75) Inventors: Kenji Haze; Kouji Sonda, both of Hyogo (JP)

(73) Assignees: Mitsubishi Denki Kabushiki Kaisha, Tokyo; Ryoden Semiconductor System Engineering Corporation, Itami, both of (JP)

( * ) Notice: Subject to any disclaimer, the term of this patent is extended or adjusted under 35 U.S.C. 154(b) by 0 days.

(21) Appl. No.: 09/034,323

(22) Filed: Mar. 4, 1998

(30) Foreign Application Priority Data

Sep. 3, 1997 (JP) .................................................. 9-238373

(51) Int. Cl.$^7$ .................................................. C23C 14/00
(52) U.S. Cl. ..................... 324/709; 324/102; 315/111.21
(58) Field of Search ................................. 324/709, 102, 324/627, 628, 127; 156/345; 315/111.21

(56) References Cited

U.S. PATENT DOCUMENTS

| | | | |
|---|---|---|---|
| 2,176,757 | * 10/1939 | Borden | 324/627 |
| 3,467,864 | * 9/1969 | Plaats | 324/102 |
| 4,808,917 | * 2/1989 | Fernandes et al. | 324/127 |
| 5,077,499 | * 12/1991 | Oku | 315/111.21 |
| 5,321,363 | * 6/1994 | Wakamatsu et al. | 324/523 |
| 5,378,992 | * 1/1995 | Murphy | 324/627 |
| 5,576,629 | * 11/1996 | Turner et al. | 324/709 |
| 5,849,136 | * 12/1998 | Mintz et al. | 156/345 |
| 5,861,752 | * 1/1999 | Klick | 324/464 |

* cited by examiner

Primary Examiner—Safet Metjahic
Assistant Examiner—Jimmy Nguyen
(74) Attorney, Agent, or Firm—Oblon, Spivak, McClelland, Maier & Neustadt, P.C.

(57) ABSTRACT

A radio-frequency power supply (1) and a matching box (2) are electrically connected with a coaxial cable (4) while the matching box (2) and a main unit (3) are electrically connected with a coaxial cable (5). Around the coaxial cable (5), a radio-frequency current transformer (6) is provided and an output signal from the radio-frequency current transformer (6) is given to an oscilloscope (7). In an apparatus using the radio-frequency power supply, with this constitution, a method for measuring a radio-frequency current can be provided, by which spurious components and frequency variation of the radio-frequency current can be measured simply and precisely at a low cost, without changing a series of communication paths, such as the coaxial cable, for the radio-frequency current.

10 Claims, 6 Drawing Sheets

METHOD FOR MEASURING RADIO-FREQUENCY CURRENT

BACKGROUND OF THE INVENTION

1. Field of the Invention

The present invention relates to a method for measuring a radio-frequency current outputted from a radio-frequency power supply, and more particularly to a method for easily measuring a radio-frequency current.

2. Description of the Related Art

FIG. 10 is a schematic view showing a constitution of a plasma etching apparatus 90. The plasma etching apparatus is a dry-etching apparatus utilizing plasma of reactive gas generated by radio-frequency discharge. As shown in FIG. 10, a radio-frequency output from a radio-frequency (RF) power supply 1 is supplied to a main unit 3 through a matching box 2. The main unit 3 has a cathode electrode 3*a* electrically connected to the matching box 2 and an anode electrode 3*b* connected to a ground potential in a reaction chamber 31 which is a vacuum container. In etching, the plasma of the reactive gas is generated by the radio-frequency discharge between the cathode electrode 3*a* and the anode electrode 3*b*.

The radio-frequency power supply 1 and the matching box 2 are electrically connected with a coaxial cable 4 while the matching box 2 and the main unit 3 are electrically connected with a coaxial cable 5.

Next, operation of the plasma etching apparatus will be discussed. For example, the radio-frequency output from the radio-frequency power supply 1 is supplied between the cathode electrode 3*a* and the anode electrode 3*b* through the coaxial cable 4, the matching box 2, and the coaxial cable 5 as a traveling wave, to generate the plasma of the reactive gas between the cathode electrode 3*a* and the anode electrode 3*b*. The radio-frequency output supplied as a traveling wave is consumed to maintain the plasma of the reactive gas. At this time, some of the traveling wave is reflected by the plasma of the reactive gas and goes back to the matching box 2 through the coaxial cable 5 as a reflected wave. The matching box 2 performs matching using a combination of a coil (L) and a capacitor (C) to counteract the reflected wave, and therefore almost all the traveling wave is supplied to a load.

The radio-frequency power supply 1 is provided with an output meter to monitor the radio-frequency output, and when the reflected wave increases due to some abnormality, the output meter does not indicate a predetermined radio-frequency output, to thereby indicate occurrence of an abnormality.

In this case, a radio-frequency power-meter sensor 10*a* is interposed between the matching box 2 and the main unit 3, as shown in FIG. 11. The radio-frequency power-meter sensor 10*a* has an input terminal connected to the coaxial cable 5 disconnected from the main unit 3 and an output terminal connected to the main unit 3 with a coaxial cable 10*b*. This is referred to as "an in-line mode". Further, the radio-frequency power-meter sensor 10*a* is connected to a radio-frequency power meter 10 to measure the radio-frequency output from the radio-frequency power supply 1. The radio-frequency power-meter sensor 10*a* is a directional coupler, and the radio-frequency power meter 10 has a constitution to simultaneously indicate the traveling wave and the reflected wave.

When the abnormality occurs, since the value of the traveling wave decreases and the value of the reflected wave increases, a parameter for generating the plasma should be controlled to decrease the value of the reflected wave and the connection of the coaxial cables should be checked.

Thus, in an apparatus using the radio-frequency power supply such as the plasma etching apparatus, the radio-frequency power-meter sensor 10*a* is interposed between the matching box 2 and the main unit 3 to measure the radio-frequency current when some abnormality occurs. Therefore, there arises the necessity for disconnecting the coaxial cable 5 from the main unit 3 and connecting it to the radio-frequency power-meter sensor 10*a* and for connecting the radio-frequency power-meter sensor 10*a* and the main unit 3 with the different coaxial cable 10*b*.

If the abnormality occurs due to poor connection at a connector of the coaxial cables, for example, the abnormality is resolved by changing the connecting condition at the connector through interposing the radio-frequency power-meter sensor 10*a*, and the cause of the abnormality is not clarified.

Furthermore, the voltage/current meter for the radio-frequency output built in the radio-frequency power supply or the radio-frequency power meter connected in the in-line mode can indicate only a total of the radio-frequency output and a costly measurement system is required in order to measure superimposition of spurious components such as higher-order harmonics or subtle variation of the radio-frequency output, and moreover, obtained are data after advanced-processing with a computer such as noise cuts, not original radio-frequency output.

SUMMARY OF THE INVENTION

The present invention is directed to a method for measuring a radio-frequency current. According to a first aspect of the present invention, the method is used for measuring the radio-frequency current outputted from a radio-frequency power supply, and in the method, the radio-frequency current is applied to a load through a coaxial cable, at least one radio-frequency current transformer is provided around the coaxial cable, and a leak current from the coaxial cable is measured, to thereby indirectly measure the radio-frequency current flowing through the coaxial cable.

According to a second aspect of the present invention, in the method of the first aspect, a matching box is disposed in the middle of the coaxial cable to match an impedance on the side of the load with an impedance on the side of the radio-frequency power supply, the coaxial cable includes a first coaxial cable electrically connecting the radio-frequency power supply and the matching box; and a second coaxial cable electrically connecting the matching box and the load, and the at least one radio-frequency current transformer is provided around the first coaxial cable.

According to a third aspect of the present invention, in the method of the first aspect, a matching box is disposed in the middle of the coaxial cable to match an impedance on the side of the load with an impedance on the side of the radio-frequency power supply, the coaxial cable includes a first coaxial cable electrically connecting the radio-frequency power supply and the matching box; and a second coaxial cable electrically connecting the matching box and the load, and the at least one radio-frequency current transformer is provided around the second coaxial cable.

According to a fourth aspect of the present invention, in the method of the first aspect, a matching box is disposed in the middle of the coaxial cable to match an impedance on the side of the load with an impedance on the side of the radio-frequency power supply, the coaxial cable includes a first coaxial cable electrically connecting the radio-frequency power supply and the matching box; and a second coaxial cable electrically connecting the matching box and the load. The at least one radio-frequency current transformer includes first and second radio-frequency current transforms, the first current transformer is provided around the first coaxial cable, the second current transformer is provided around the second coaxial cable, and outputs from the first and second radio-frequency current transformers are given to one measuring apparatus.

According to a fifth aspect of the present invention, in the method of the second to fourth aspects, the load is plasma generated in a region defined by two electrodes opposed to each other being supplied with the radio-frequency current.

According to a sixth aspect of the present invention, in the method of the first aspect, the at least one radio-frequency current transformer is provided movably along the coaxial cable, and the at least one radio-frequency current transformer is moved along the coaxial cable, to measure the radio-frequency current.

According to a seventh aspect of the present invention, in the method of the first aspect, the coaxial cable has a conductor mesh as an outer conductor.

According to an eighth aspect of the present invention, in the method of the first aspect, the at least one radio-frequency current transformer is a clamp-type radio-frequency current transformer having a ring-shaped appearance and divided into two in a direction of diameter with a cut portion, and one end of the cut portion is hinged and the other is openable/closable.

In the method of the first aspect of the present invention, the leak current from the coaxial cable is measured with at least one radio-frequency current transformer provided around the coaxial cable and an output from the radio-frequency current transformer is captured into, for example, an oscilloscope, whereby a waveform of the radio-frequency current flowing through the coaxial cable can be indirectly observed. Therefore, compared with the background-art method where a radio-frequency current meter or a radio-frequency power meter is interposed between coaxial cables to measure the radio-frequency current, a waveform of a wave outputted from the radio-frequency power supply, a waveform of a wave from the radio-frequency power supply including the reflected wave and data on spurious components superimposed on these waveforms can be obtained, and it becomes possible to grasp variation of the load and variation of the radio-frequency power supply from the data.

In the method of the second aspect of the present invention, through measuring a waveform of the radio-frequency current in the first coaxial cable electrically connecting the radio-frequency power supply and the matching box, the waveform of the wave outputted from the radio-frequency power supply and spurious components superimposed on the waveform can be measured, and it thereby becomes possible to grasp variation of the load and variation of the radio-frequency power supply.

In the method of the third aspect of the present invention, through measuring a waveform of the radio-frequency current in the second coaxial cable electrically connecting the matching box and the load, the waveform of the wave outputted from the radio-frequency power supply including the reflected wave and spurious components superimposed on the waveform can be measured, and it thereby becomes possible to grasp variation of the load and variation of the radio-frequency power supply.

In the method of the fourth aspect of the present invention, through measuring a waveform of the radio-frequency current in the first coaxial cable electrically connecting the radio-frequency power supply and the matching box and the second coaxial cable electrically connecting the matching box and the load, the waveform of the traveling wave and the waveform including the reflected wave of the radio-frequency current can be measured and, from a difference therebetween, the existence of the reflected wave is clearly recognized, and obtained data on the reflected wave can be fed back to control load variation and output of the radio-frequency power supply.

In the method of the fifth aspect of the present invention, the waveform of the wave outputted from the radio-frequency power supply and the waveform of the wave from the radio-frequency power supply including the reflected wave are given to the measuring device, where these waveforms are compared, and from the data on the spurious components, a state of the plasma which is the load of the radio-frequency power supply can be grasped, to thereby check the relation between the plasma parameter and the plasma characteristics. Therefore, in a semiconductor manufacturing apparatus using the plasma, the plasma parameter including the amount of flow of gas for plasma generation, the degree of vacuum in the plasma generation chamber, the power of the radio-frequency output and so on is compared with the spurious components while being properly controlled, and a processing state of processed objects in each condition is checked, to thereby make a reference of the processing state relative to the spurious components. With this reference, a uniform processing state can be achieved among a plurality of semiconductor manufacturing apparatuses having an apparatus model difference.

In the method of the sixth aspect of the present invention, since the radio-frequency current is leaked from the connecting portion in a case of poor connection of the coaxial cable, there occurs a phenomenon that the waveform sharply rises as the moving radio-frequency current transformer gets closer to that portion and so on, and the defective portion can be thereby specified. Also in a case of breakage of the coaxial cable due to concentration of the radio-frequency current, since the radio-frequency current is leaked out, a breakage portion can be detected by moving the radio-frequency current transformer along the coaxial cable.

In the method of the seventh aspect of the present invention, with the coaxial cable having the conductor mesh as the outer conductor, the leak current from the coaxial cable increases, allowing more precise measurement of the radio-frequency current flowing through the coaxial cable.

In the method of the eighth aspect of the present invention, using the clamp-type radio-frequency current transformer eliminates the necessity for interrupting the feed for the load during its attachment to or detachment from the coaxial cable and allows easy change of the radio-frequency current transformer in the event of failure.

An object of the present invention is to provide a method for measuring a radio-frequency current, by which the spurious components and frequency variation of the radio-frequency current can be measured easily and precisely at a low cost, without changing a series of communication paths for the radio-frequency output such as coaxial cables in an apparatus using a radio-frequency power supply.

These and other objects, features, aspects and advantages of the present invention will become more apparent from the following detailed description of the present invention when taken in conjunction with the accompanying drawings.

DETAILED DESCRIPTION OF THE PREFERRED EMBODIMENTS

<A. The First Preferred Embodiment>

<A-1. Apparatus Constitution>

Figure 1:
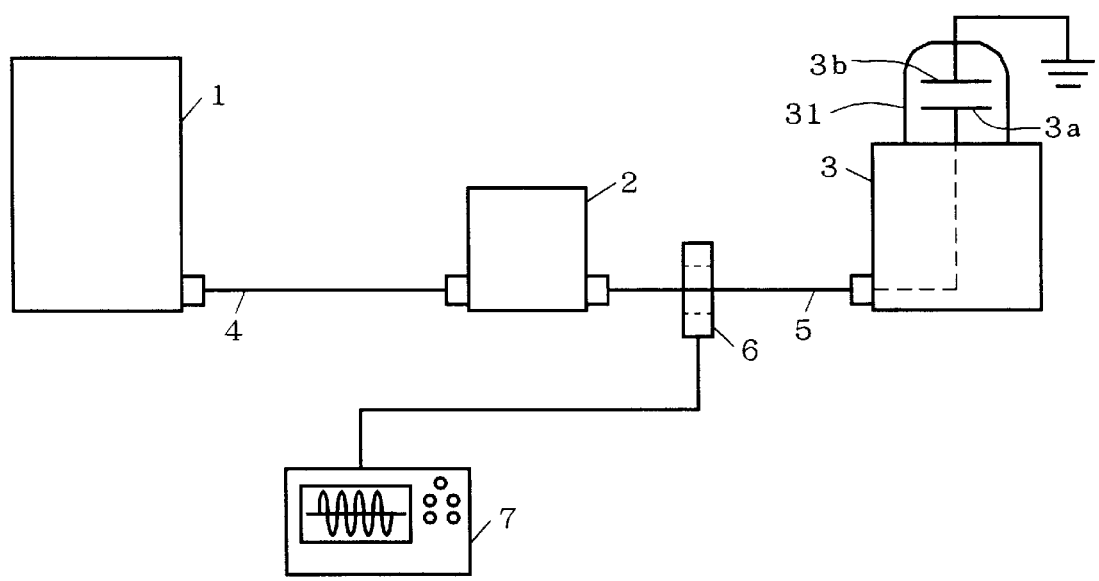
FIG. 1 is a diagram of apparatus constitution for illustrating a method for measuring a radio-frequency current in accordance with a first preferred embodiment of the present invention.

A method for measuring a radio-frequency current in accordance with the first preferred embodiment of the present invention will be discussed with reference to FIGS. 1 to 5. FIG. 1 is a schematic view showing a constitution of the plasma etching apparatus 90 incorporating a system for measuring a radio-frequency current. As shown in FIG. 1, the radio-frequency output from the radio-frequency (RF) power supply 1 is supplied to the main unit 3 through the matching box 2. The main unit 3 has the cathode electrode 3a electrically connected to the matching box 2 and the anode electrode 3b connected to the ground potential in the reaction chamber 31 which is a vacuum container. In etching, the plasma of the reactive gas is generated between the cathode electrode 3a and the anode electrode 3b. The range of radio frequency is not clearly defined, but in the following discussion, covers VHF band to UHF band not more than 3000 MHZ.

The radio-frequency power supply 1 and the matching box 2 are electrically connected with the coaxial cable 4 (the first coaxial cable), while the matching box 2 and the main unit 3 are electrically connected with the coaxial cable 5 (the second coaxial cable). Around the coaxial cable 5 provided is a clamp-type radio-frequency current transformer (CT) 6 the output signal of which is supplied to oscilloscope 7.

Now, discussion will be presented of a coaxial cable, which is a key element of the present invention. A Lecher wire of two-wire system used in low frequency is unsuitable for a transmission line in high frequency because electric power radiated into space increases in proportion to the square of the frequency. Then, for high frequency used is a transmission line having a structure to transmit electromagnetic wave confined by electric field and magnetic field. To transmit the radio-frequency current from the radio-frequency power supply used in a semiconductor manufacturing apparatus such as a sputtering apparatus, a dry-etching apparatus and a plasma CVD apparatus, in general, a coaxial line is used. The coaxial line has a property to transmit the electromagnetic wave in a TEM (Transverse Electro Magnetic Wave) mode where neither electric field component nor magnetic field component exists. Further, it has a structure in which the electric field and the magnetic field basically exist within a plane perpendicular to an axis, not radiating out.

For example, a semi-rigid cable used for interconnection in a radio-frequency apparatus has an outer conductor covered with a seamless thin copper pipe to confine the electromagnetic wave in the pipe, not radiating out. The generally-used coaxial cable, however, has a structure where a center conductor is circumferentially covered with an insulating member made of dielectric substance such as polyethylene, the insulating member is circumferentially covered with a metal mesh serving as an outer conductor and the outer conductor is circumferentially covered with a coating member such as rubber and vinyl. The coaxial cable according to MIL (Military Specification) should have a shield density of 96 to 97%, but most of the coaxial cables in general have a shield density of 70 to 80%.

Utilizing this imperfection of shield, in other words, some radiation out into space occurs and observation of relative current value and waveform of the radio-frequency output from the radio-frequency power supply can be achieved by providing the radio-frequency current transformer (CT) around the coaxial cable.

A current transformer is a device to indirectly measure a current in a current path by measuring a current generated through electromagnetic induction when an annular magnetic material is disposed around the current line. The radio-frequency current transformer is a device for measuring a radio-frequency current, and is used for measuring, for example, a radio-frequency current existing as a noise, an inverter current or a switching current. In the background art, however, there is no idea that the radio-frequency current flowing through the coaxial cable can be measured. That's because it is believed that the radio-frequency current in the coaxial cable is almost completely shielded and there leaks too little radio-frequency current to measure the radio-frequency current flowing through the coaxial cable by the radio-frequency current transformer. Those who are more familiar with handling the radio-frequency current have this tendency more strongly, with a recognition that the coaxial cable is a safe transmission path without leaking radio frequency. Moreover, since the radio-frequency current transformer is not so general as to be found anywhere and is used in a extremely limited field, no one disposes the radio-frequency current transformer around the coaxial cable without any definite purpose.

The inventors and the like have come to the idea that there may be radiation out of the coaxial cable due to leak current, judging from the shield density of the coaxial cable, and prepare the radio-frequency current transformer 6 to perform an indirect measurement of the radio-frequency current flowing through the coaxial cable 5 with the constitution of FIG. 1.

<A-2. Characteristic Action and Effect>

Figure 2:
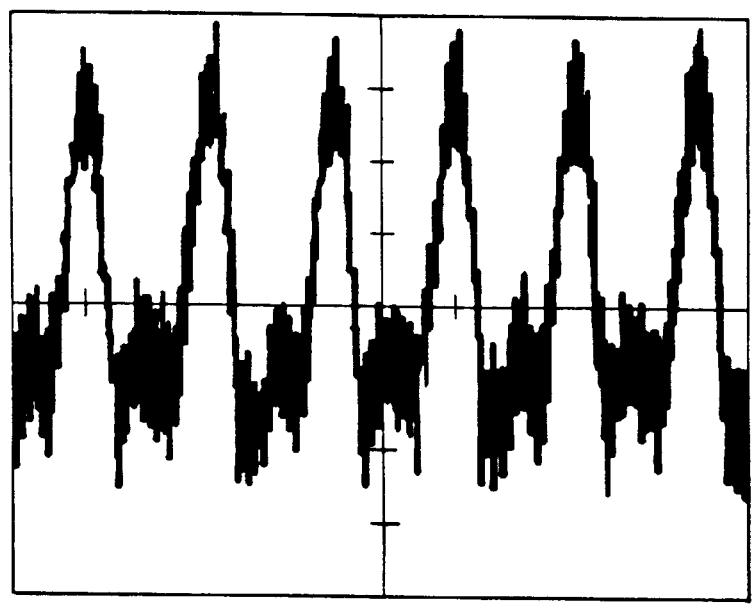
FIG. 2 shows a waveform of radio-frequency current obtained by the method for measuring a radio-frequency current of the present invention.

FIG. 2 shows a waveform of the radio-frequency current displayed on the oscilloscope 7. In FIG. 2, a waveform having a sharp peak is a main waveform of the radio-frequency current. Further, the spurious components of higher frequency are superimposed on the main waveform of the radio-frequency current, and therefore a contour of the waveform of the radio-frequency current is indefinite.

Figure 3:
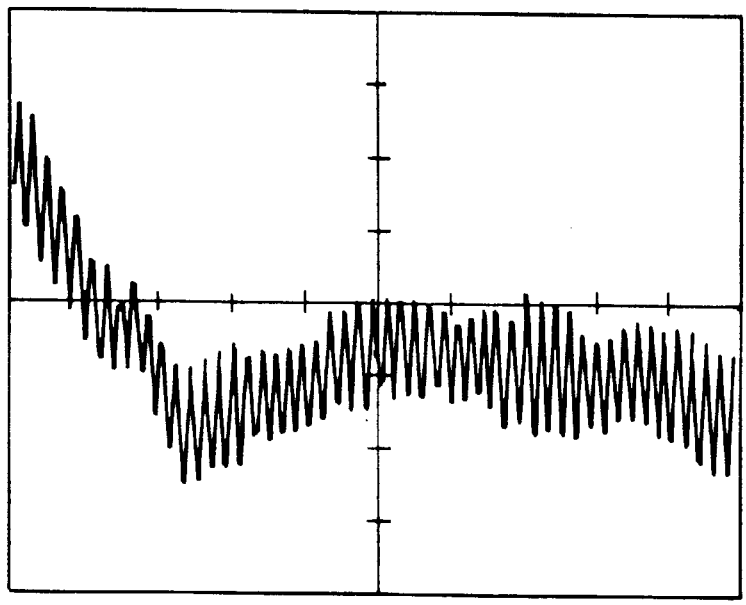
FIG. 3 is a partially-enlarged view of the waveform of radio-frequency current obtained by the method for measuring a radio-frequency current of the present invention.

Partial representation of the waveform of FIG. 2 for shorter sampling time is given in FIG. 3. It is clearly seen from FIG. 3 that higher-order harmonics as the spurious component is superimposed on the main waveform. It is believed that the higher-order harmonics should be caused by the plasma between the cathode electrode 3a and the anode electrode 3b, and therefore the higher-order harmonics vary with changes in plasma characteristics.

The plasma characteristics control the etching characteristics, e.g., etching rate, and in some cases the plasma characteristics remarkably change with a subtle change of the plasma parameter.

Figure 10:
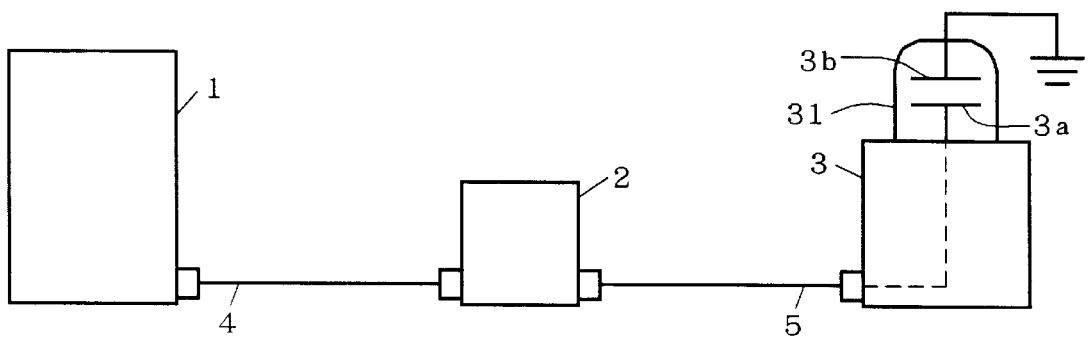
FIG. 10 is a schematic view showing a constitution of a plasma etching apparatus.
Figure 11:
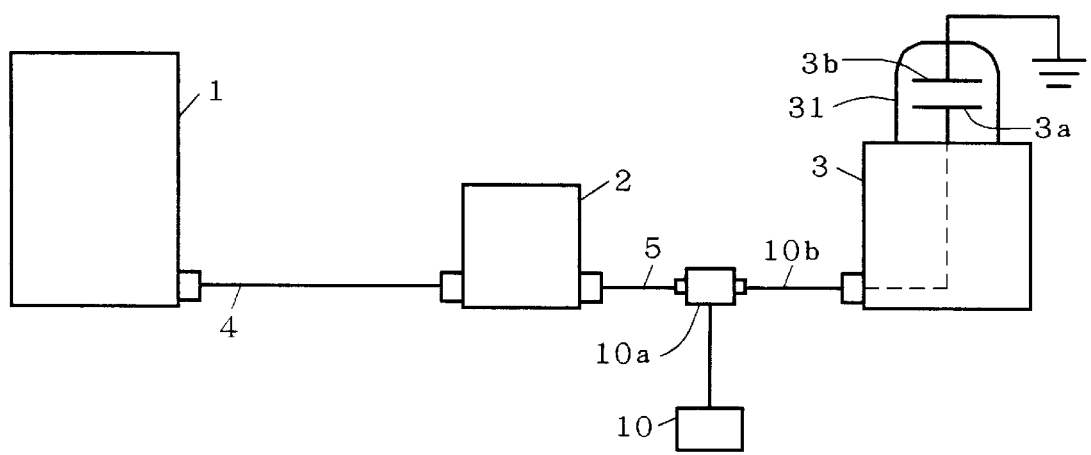
FIG. 11 is a diagram of apparatus constitution for illustrating a method for measuring a radio-frequency current in the background art.
Figure 1:
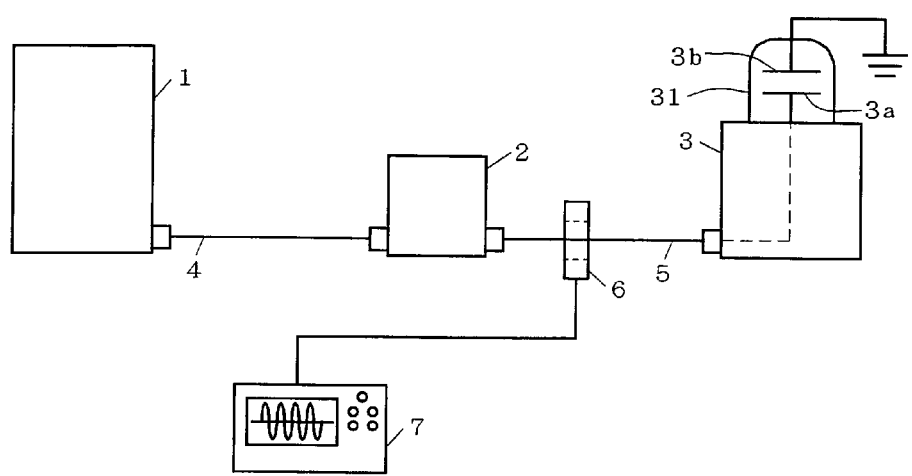
Figure 2:
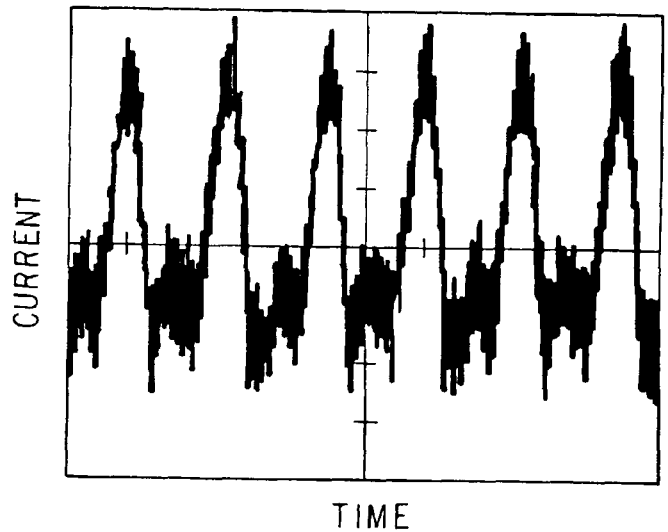
Figure 3:
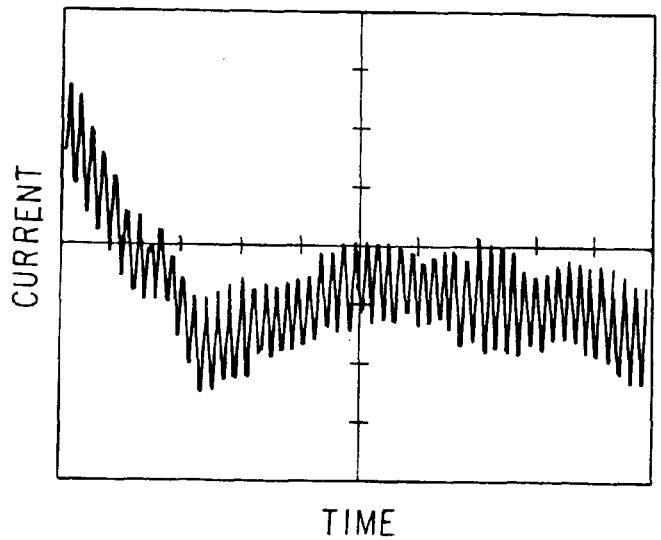
Figure 4:
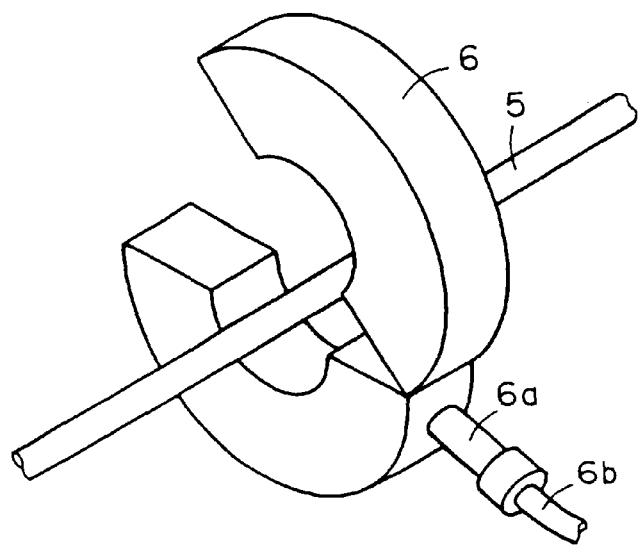
Figure 5:
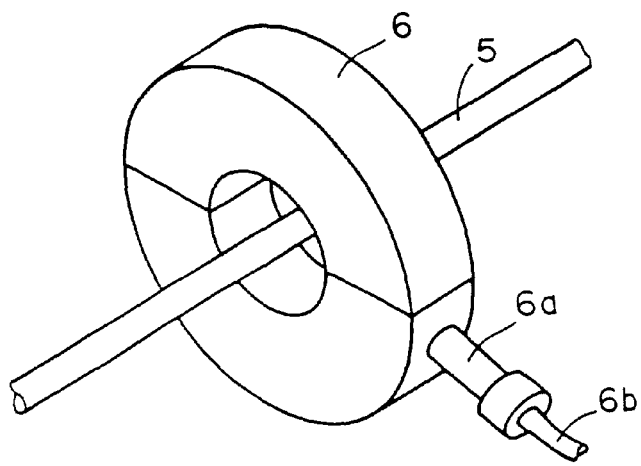
Figure 6:
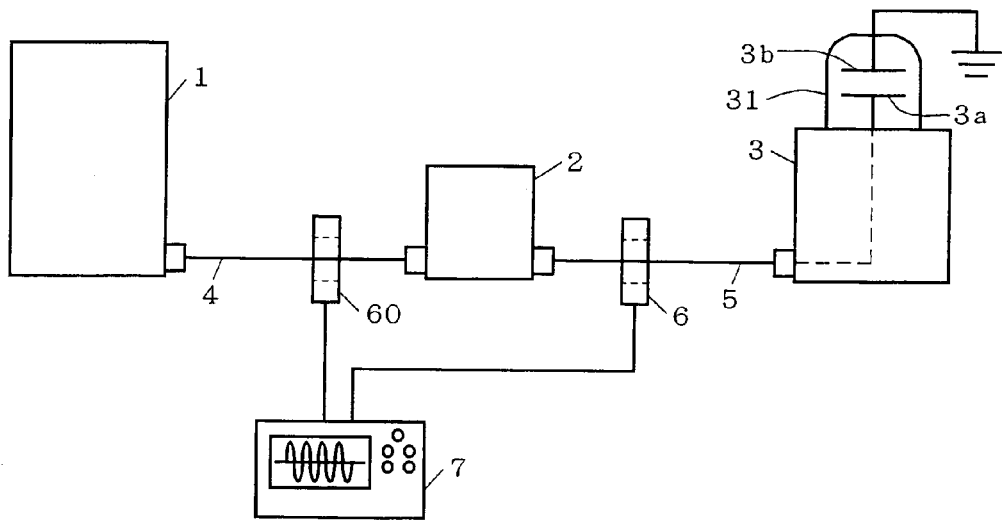
Figure 7:
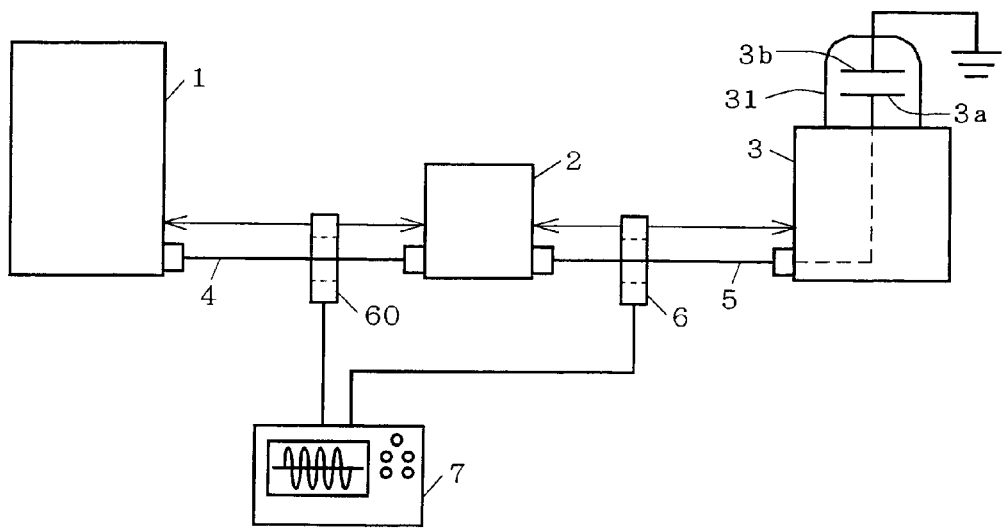
Figure 8:
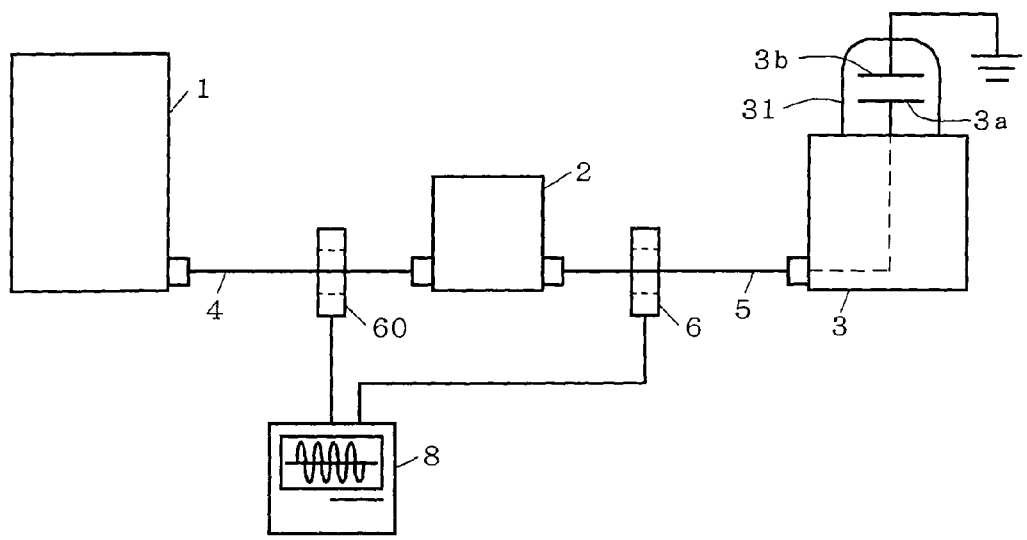
Figure 9:
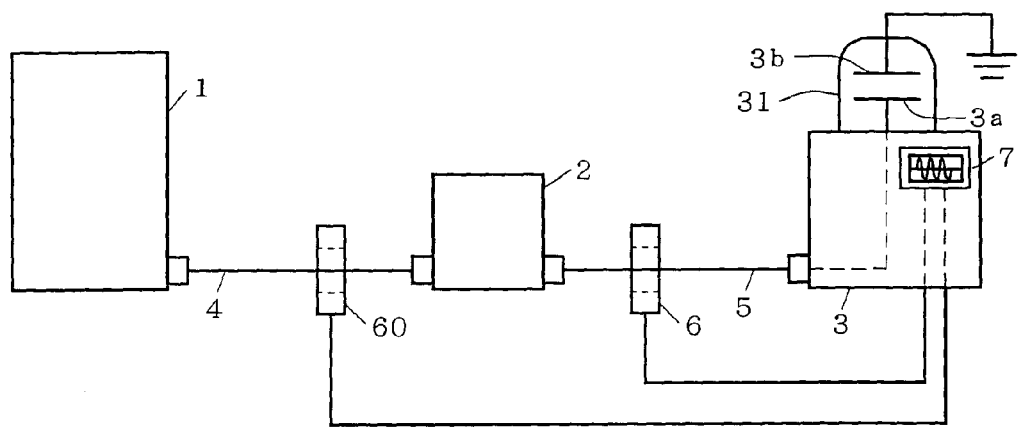
Figure 10:
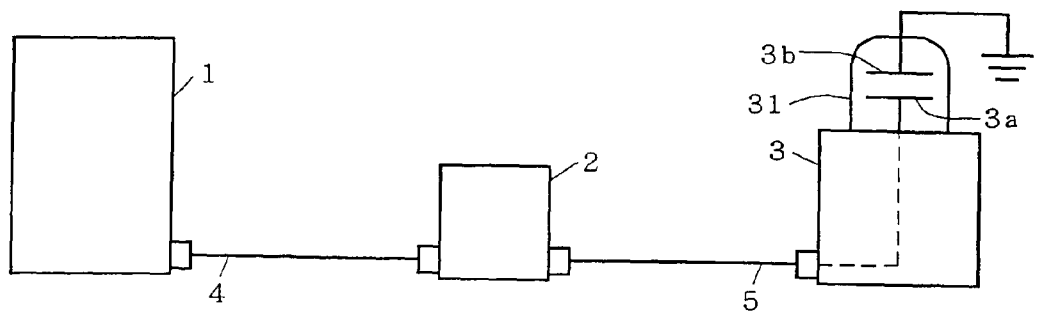
Figure 11:
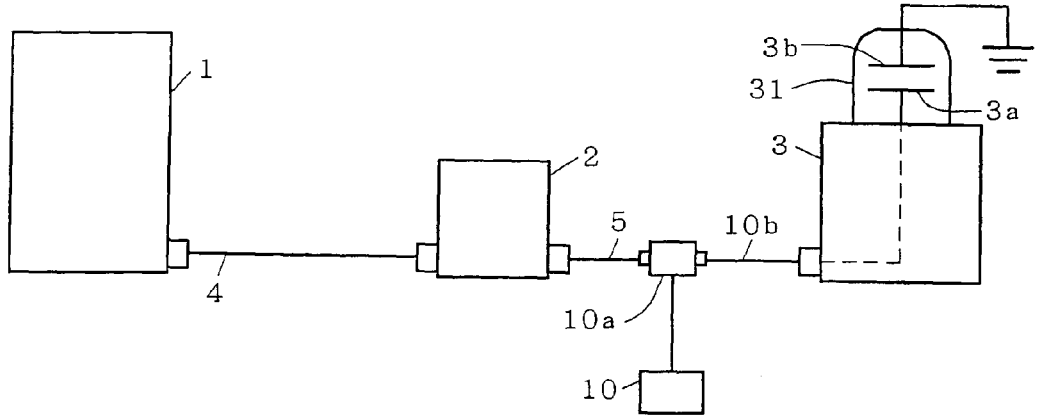

The background-art method for measuring the radio-frequency current as discussed with reference to FIG. 10 allows measurement of the power, voltage and current value of the radio-frequency output but does not allow measurement of the waveform of the radio-frequency current, and therefore it has been impossible to recognize the change in higher-order harmonics with the change in plasma characteristics.

For example, between two plasma etching apparatuses of the same constitution, there may be a difference in etching state due to apparatus model differences even if the power of the radio-frequency output and other plasma parameters are set equal. The cause that the waveforms of the waves outputted from the radio-frequency power supply are not completely the same and there is subtle differences in plasma parameter, and in this case, an operator changes, based on experience, the power of the radio-frequency output and the like on a device-by-device basis. The method for measuring the radio-frequency current of the present invention, however, allows measurement of the spurious components reflecting the waveform of the wave outputted from the radio-frequency power supply and the plasma characteristics by measuring the waveform of the radio-frequency current, and therefore the method makes it possible to pursue the cause of the difference in etching state by observing the spurious components while changing the plasma parameter.

Specifically, the plasma parameter includes the amount of flow of gas for plasma generation, the degree of vacuum in the reaction chamber, the power of the radio-frequency output and so on, being properly controlled, and are compared with the spurious components, and the etching state is checked under each condition to make a reference of etching state relative to the spurious components. With this reference, a uniform etching state can be achieved among a plurality of plasma etching apparatuses having an apparatus model difference.

Further, in order to make the above reference, it is necessary to store data by constant measurement of the waveform of the wave outputted from the radio-frequency power supply and the spurious components, and in order to control the plasma parameter on the basis of the reference, it is desirable to provide the clamp-type radio-frequency current transformer 6 at all times. The radio-frequency current transformer 6 is low in cost and therefore it is advantageous that provision of the radio-frequency current transformer 6 for the coaxial cable at all times is not of great expense.

Figure 4:
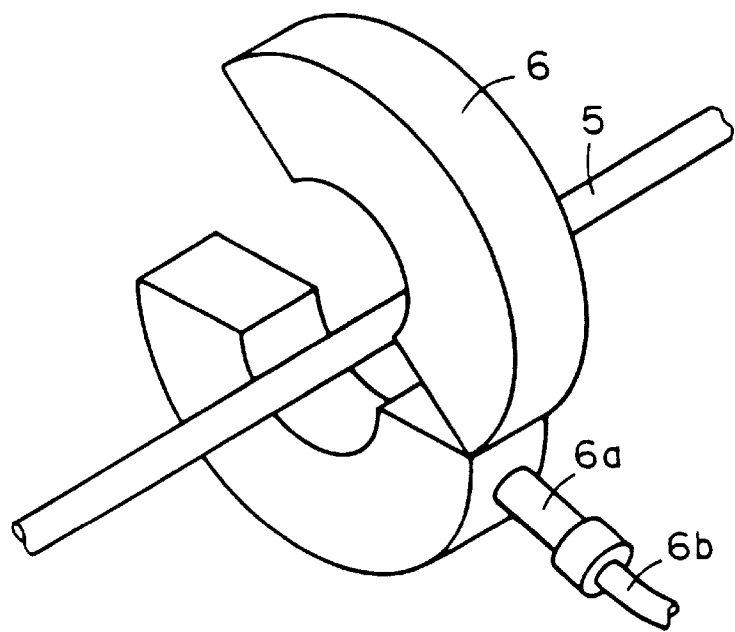
FIGS. 4 and 5 are perspective views illustrating attachment of a clamp type radio-frequency current transformer.
Figure 5:
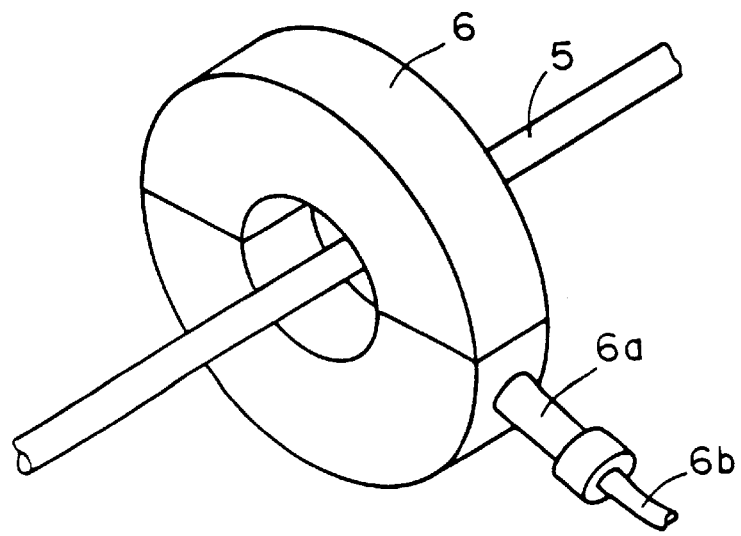

FIG. 4 schematically illustrates provision of the clamp-type radio-frequency current transformer 6 around the coaxial cable 5. The radio-frequency current transformer 6 is ring-shaped, and divided into two in a direction of diameter with a cut portion, and one end of the cut portion is hinged and the other is openable/closable. To provide the radio-frequency current transformer 6 around the coaxial cable 5, the radio-frequency current transformer 6 is once opened to dispose the coaxial cable 5 so that the coaxial cable 5 should penetrate the ring, and then closed. Further, the radio-frequency current transformer 6 has an output terminal 6a connected to a output cable 6b. FIG. 5 schematically illustrates a state where the radio-frequency current transformer 6 is completely provided. As to the characteristic specification, the radio-frequency current transformer 6 which is generally used has frequency of 2 kHz to 30 MHZ and through current of about 0 to 10 A.

Using the clamp-type radio-frequency current transformer 6 eliminates the necessity for suspending the feed for the load during its attachment to and detachment from the coaxial cable 5. Therefore, it is possible to freely attach/detach the radio-frequency current transformer 6 during operation of the plasma etching apparatus and easily change the radio-frequency current transformer 6 in the event of failure. Moreover, because of no necessity for detaching the coaxial cable serving as a feeder line, there arises no problem that a defective portion due to poor connection of the coaxial cable can not be specified. Furthermore, it is natural that there arises no problem of attenuation of the radio-frequency output, which would occur in a case where the detector is connected in the in-line mode.

<A-3. Modification>

Though the above discussion is made on an example of providing the clamp-type radio-frequency current transformer 6 around the coaxial cable 5, the radio-frequency current transformer 6 may be provided around the coaxial cable 4 which connects the radio-frequency power supply 1 and the matching box 2. In this case, though it is impossible to measure the waveform including the reflected wave, it is possible to measure the spurious components passing the matching box 2 and the same action and effect as discussed above can be achieved.

<B. The Second Preferred Embodiment>

<B-1. Apparatus Constitution>

Figure 6:
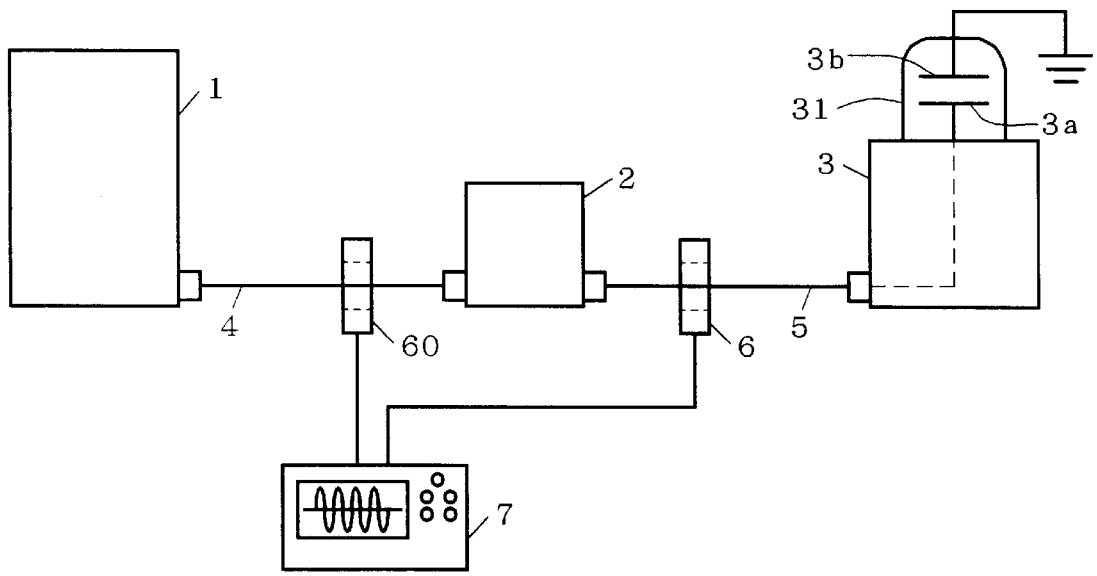
FIG. 6 is a diagram of apparatus constitution for illustrating a method for measuring a radio-frequency current in accordance with a second preferred embodiment of the present invention.

A method for measuring a radio-frequency current in accordance with the second preferred embodiment will be discussed with reference to FIG. 6. FIG. 6 is a schematic view showing a constitution of the plasma etching apparatus 90 incorporating a system for measuring a radio-frequency current. In FIG. 6, like reference numerals are used to refer to the same elements as shown in FIG. 1 and redundant description is omitted.

In FIG. 6, the clamp-type radio-frequency current transformer 6 (the second radio-frequency current transformer) is provided around the coaxial cable 5 which electrically connects the matching box 2 and the main unit 3, and a radio-frequency current transformer 60 (the first radio-frequency current transformer) is provided around the coaxial cable 4 which electrically connects the radio-frequency power supply 1 and the matching box 2. Output signals from the radio-frequency current transformers 6 and 60 are given to the oscilloscope 7.

<B-2. Characteristic Action and Effect>

The radio-frequency output of the radio-frequency power supply 1 is transmitted through the coaxial cable 4 as the traveling wave, then through the matching box 2 and the coaxial cable 5, to the cathode electrode 3a and the anode electrode 3b, where the output is consumed. In a radio-frequency circuit, it is necessary to equalize the impedance of the load and the characteristic impedance of the power supply and transmission line, which is why the matching box 2 is provided. The radio-frequency current outputted as the traveling wave generates little reflected wave when the impedance of the load is uniform and once controlled. If the plasma is the load, the impedance may vary with the plasma state, and in this case, the traveling wave becomes the reflected wave, which goes back to the matching box 2 through the coaxial cable 5.

Through measurement of the traveling wave by the radio-frequency current transformer 60 provided around the coaxial cable 4 and measurement of the waveform including the reflected wave by the radio-frequency current transformer 6 provided around the coaxial cable 5, it is possible to clearly recognize the existence of the reflected wave from the difference between the measurement results and feed the data on the reflected wave back, to control the plasma parameter.

Specifically, in a comparison between the waveform of the traveling wave and the waveform including the reflected wave, generally, the latter is lower than the former in peak value. That's because the reflected wave counteracts the traveling wave. Therefore, it is expected that if the reflected wave is attenuated, the waveform including the reflected wave gets closer to the waveform of the traveling wave (the waveform of the wave outputted from the radio-frequency power supply 1). For optimum control, it is necessary to control the plasma parameter such as the amount of flow of the gas for plasma generation and the degree of vacuum of the reaction chamber so that the waveform including the reflected wave may get closer to the waveform of the traveling wave.

Furthermore, though it is possible to control the plasma parameter simply so that the reflected wave may be decreased in the background-art measurement method where the detector is provided in the in-line mode to measure the amplitude of the traveling wave and the reflected wave. Since the shape of the waveform of the traveling wave and the waveform including the reflected wave can be measured in the measurement method of the present invention, it is possible to recognize a phenomenon that can not be grasped from the amplitude of the traveling wave and the reflected wave background-art measurement, and more precisely control the plasma parameter by controlling the plasma parameter so that the shape of the waveforms may become identical.

Moreover, an increase of the reflected wave is caused not only by variation of the plasma parameter but also by poor connection and breakage of the coaxial cable. Also in this case, the measurement method of the present invention can easily specify the defective portion. Hereafter, how to specify the defective portion will be discussed.

<B-3. Method of Specifying Defective Portion of Coaxial Cable>

Figure 7:
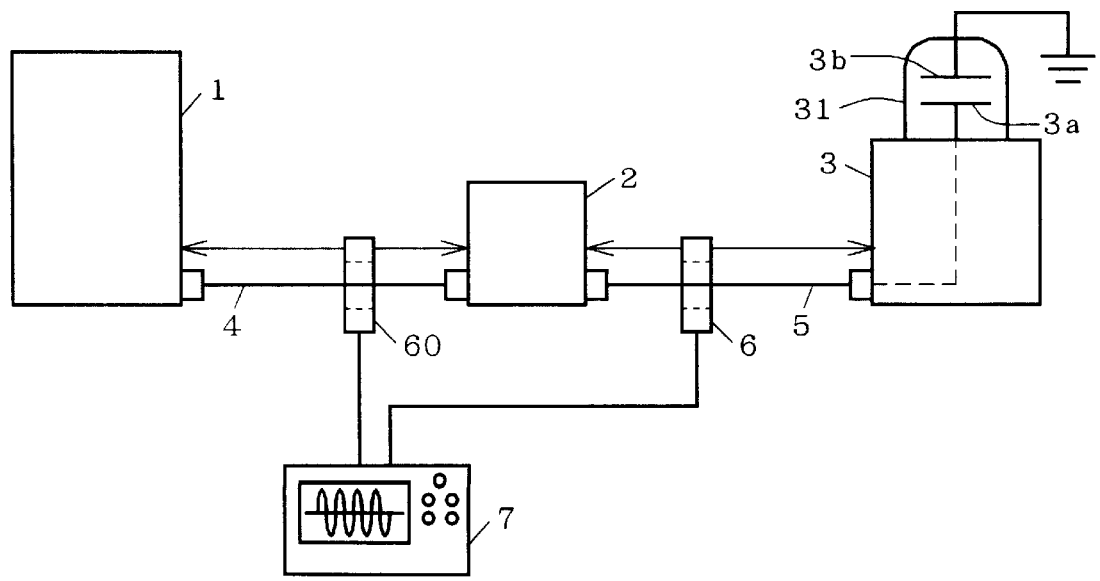
FIG. 7 is a schematic view illustrating a method of specifying a defective portion of a coaxial cable.

FIG. 7 is a schematic view illustrating a method specifying the defective portion of the coaxial cable. In FIG. 7, like reference numerals are used to refer to the same elements as shown in FIG. 6 and redundant description is omitted.

As shown in FIG. 7, the radio-frequency current transformers 6 and 60 are moved along the coaxial cables 4 and 5, to thereby specify the defective portion of the coaxial cables 4 and 5. Specifically, in a case of poor connection of the coaxial cable, a radio-frequency current is leaked out from the connecting portion (connector), causing a phenomenon that the waveform sharply rises when the radio-frequency current transformers 6 and 60 get closer to that portion, whereby the defective portion can be specified. Also in a case of breakage of the coaxial cable due to concentration of the radio-frequency current, the radio-frequency current is leaked out and therefore the breakage portion is detected by the radio-frequency current transformers 6 and 60. Further, the moving velocity of the radio-frequency current transformers 6 and 60 has only to be slower than the velocity of trigger for signal capture in the oscilloscope 7 and the radio-frequency current transformers 6 and 60 may be moved by hand since the coaxial cables 5 and 4 do not necessarily have to be precisely positioned in the center of the radio-frequency current transformers 6 and 60.

Furthermore, though the radio-frequency current transformers 6 and 60 may be provided for the coaxial cables 5 and 4 respectively as above, in order to specify the defective portion of the coaxial cables, only one radio-frequency current transformer may be provided since the clamp-type transformer can be attached and detached easily and may be used for measuring one of the coaxial cables and then for the other.

<B-4. The First Modification>

Figure 8:
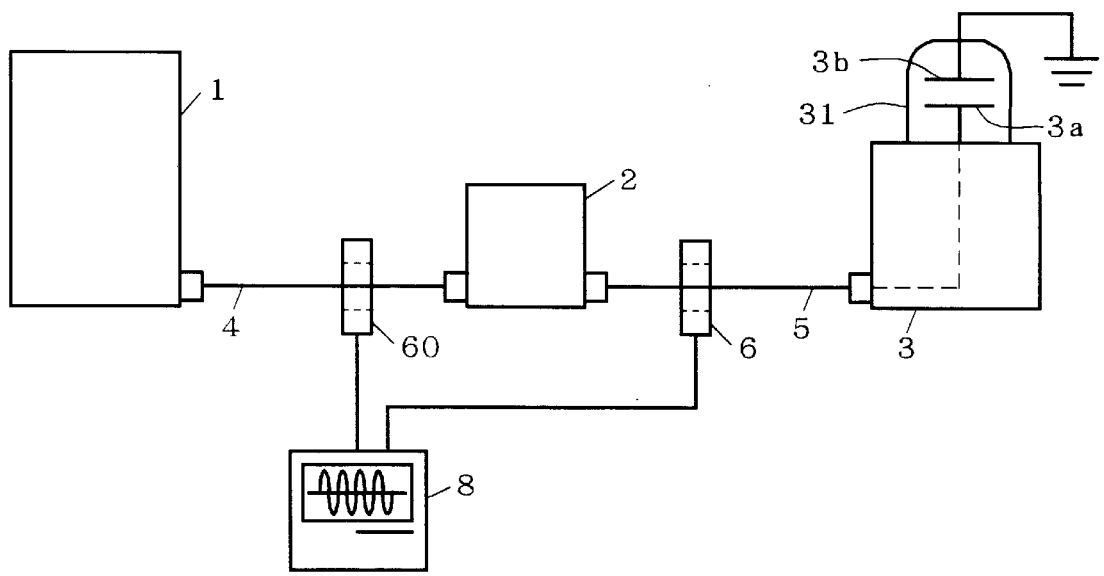
FIGS. 8 and 9 are diagrams of apparatus constitution for illustrating modifications of the method for measuring a radio-frequency current in accordance with the second preferred embodiment of the present invention.

Though the above discussion is made on the use of the oscilloscope 7 for measuring the waveform of the traveling wave and the waveform including the reflected wave as an example of the second preferred embodiment of the present invention, the signal may be captured in a personal computer 8 instead of the oscilloscope 7, as shown in FIG. 8. In FIG. 8, like reference numerals are used to refer to the same elements as shown in FIG. 6 and redundant description is omitted.

In this constitution, the personal computer 8 incorporates a program in advance to compare the waveform of the traveling wave and the waveform including the reflected wave and to output an alarm signal when there is a big difference therebetween, thereby automatically monitoring the plasma etching apparatus. Furthermore, in this case, the comparison between the waveform of the traveling wave and the waveform including the reflected wave may be performed not only in peak value but also in spurious components and the like. It is noted that the outputs from the radio-frequency current transformers 6 and 60 may be once captured in the oscilloscope 7 and then given to the personal computer 8, instead of being directly given to the personal computer 8.

<B-5. The Second Modification>

Though the above discussion is made on the use of the oscilloscope 7 for measuring the waveform of the traveling wave and the waveform including the reflected wave as an example of the second preferred embodiment of the present invention, the signal outputted from the radio-frequency current transformers 6 and 60 may be captured in a spectrum analyzer to resolve the frequency components and measure variation in frequency.

Specifically, the spectrum analyzer is a device to resolve the radio-frequency output on which signals of a plurality of frequencies are superimposed on a frequency-by-frequency basis, and to output data having a peak in accordance with signal strength. For example, assuming a fundamental frequency to be 13.56 MHZ which is suitable for generation of the radio-frequency plasma, the peak of each frequency can be outputted discretely from the fundamental frequency in positive and negative directions. Therefore, since the measurement can be made by designating harmonic components of 27.12 MHZ and higher-order harmonic components, as well as the fundamental frequency of 13.56 MHZ, when it is found that variation of a specific frequency remarkably reflects the variation in plasma parameter, measurement mainly on the variation of the frequency allows effective monitoring of the operation of the plasma etching apparatus.

Furthermore, in order to compare the waveform of the traveling wave with the waveform including the reflected wave, it is sufficient to make a comparison in fundamental frequency.

Instead of the spectrum analyzer, a fast Fourier transformation (FFT) measuring device may be used to measure the variation in frequency.

Though the above discussion is made on the use of the clamp-type radio-frequency current transformer as an example of the first and second preferred embodiments of the present invention, the clamp-type transformer is not necessary to realizing the benefits of the present invention and a non-clamp-type radio-frequency current transformer may be used. The non-clamp-type transformer is not easier to attach and detach than the clamp-type one, but that does not cause much inconvenience since the radio-frequency current transformer is not often attached and detached.

Figure 9:
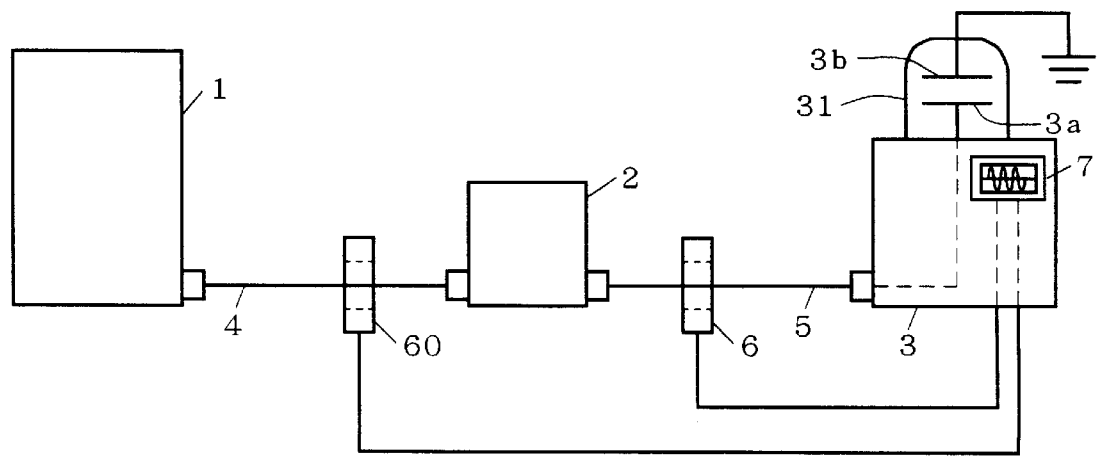

No reference is made on a location for providing the oscilloscope 7 in the above discussion on the first and second preferred embodiments of the present invention, but incorporating the oscilloscope 7 into the main unit 3 as shown in FIG. 9, for example, makes it possible for an operator of the plasma etching apparatus to monitor the radio-frequency output at hand.

Though the above discussion is made on the plasma etching apparatus and a case where the load is plasma as an example of the first and second preferred embodiments of the present invention, the present invention may be applied to a case where the load is not plasma. Specifically, only if the load and radio frequency power supply are electrically connected with a coaxial cable, the radio frequency current flowing through the coaxial cable can be measured by applying the present invention.

While the invention has been shown and described in detail, the foregoing description is in all aspects illustrative and not restrictive. It is therefore understood that numerous modifications and variations can be devised without departing from the scope of the invention.

We claim:

1. A method for measuring a radio-frequency current outputted from a radio-frequency power supply comprising:

applying said radio-frequency current to a load through a coaxial cable;

providing at least one radio-frequency current transformer positioned around outermost circumferential layer of said coaxial cable; and measuring a leakage radio-frequency radiation leaked from said coaxial cable using said transformer to thereby indirectly measure said radio-frequency current flowing through said coaxial cable.

2. The method of claim 1, further comprising:

providing a matching box disposed between said radio frequency power supply and said load to match an impedance on the side of said load with an impedance on the side of said radio-frequency power supply;

providing a first coaxial cable electrically connecting said radio-frequency power supply and said matching box;

providing a second coaxial cable electrically connecting said matching box and said load; and providing said at least one radio-frequency current transformer positioned around said first coaxial cable.

3. The method of claim 2, wherein said load is plasma generated in a region defined by two electrodes opposed to each other said electrodes being supplied with said radio-frequency current.

4. The method of claim 1, further comprising:

providing a matching box disposed between said radio frequency power supply and said load to match an impedance on the side of said load with an impedance on the side of said radio-frequency power supply;

providing a first coaxial cable electrically connecting said radio-frequency power supply and said matching box;

providing a second coaxial cable electrically connecting said matching box and said load; and providing said at least one radio-frequency current transformer positioned around said second coaxial cable.

5. The method of claim 4, wherein said load is plasma generated in a region defined by two electrodes opposed to each other, said electrodes being supplied with said radio-frequency current.

6. The method of claim 1, further comprising:

providing a matching box disposed between said radio frequency power supply and said load to match an impedance on the side of said load with an impedance on the side of said radio-frequency power supply;

providing a first coaxial cable electrically connecting said radio-frequency power supply and said matching box;

providing a second coaxial cable electrically connecting said matching box and said load;

providing said at least one radio-frequency current transformer as first and second radio-frequency current transforms;

providing said first current transformer positioned around said first coaxial cable;

providing said second current transformer is positioned around said second coaxial cable;

directing outputs from said first and second radio-frequency current transformers to one measuring apparatus.

7. The method of claim 6, wherein said load is plasma generated in a region defined by two electrodes opposed to each other, said electrodes being supplied with said radio-frequency current.

8. The method of claim 1, wherein said at least one radio-frequency current transformer is provided movably along said coaxial cable, further comprising:

moving said at least one radio-frequency current transformer along said coaxial cable, to measure said radio-frequency current.

9. The method of claim 1, further comprising applying radio frequency current to said load through a coaxial cable having a conductor mesh as an outer conductor.

10. The method of claim 1, wherein said at least one radio-frequency current transformer is a clamp-type radio-frequency current transformer having a ring-shaped appearance and is divided into two with a cut portion having first and second ends along a direction of a diameter of said ring shaped transformer, and wherein said one of said first and second ends of said cut portion is hinged, and the other of said first and second ends is openable/closable.

* * * * *

UNITED STATES PATENT AND TRADEMARK OFFICE
CERTIFICATE OF CORRECTION

PATENT NO.   : 6,333,634 B1
DATED        : December 25, 2001
INVENTOR(S)  : Kenji Haze et al.

It is certified that error appears in the above-identified patent and that said Letters Patent is hereby corrected as shown below:

<u>Drawings,</u>
Delete drawing Sheets 1-6 and replace with the Attached Drawings.

Signed and Sealed this

Twenty-first Day of January, 2003

JAMES E. ROGAN
*Director of the United States Patent and Trademark Office*